(12) United States Patent
Nomiya

(10) Patent No.: US 7,500,902 B2
(45) Date of Patent: Mar. 10, 2009

(54) THICKNESS-MEASURING METHOD DURING GRINDING PROCESS

(75) Inventor: Susumu Nomiya, Ota-ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 11/900,845

(22) Filed: Sep. 13, 2007

(65) Prior Publication Data

US 2008/0070480 A1    Mar. 20, 2008

(30) Foreign Application Priority Data

Sep. 19, 2006    (JP) .............................. 2006-253361

(51) Int. Cl.
*B24B 49/00* (2006.01)
(52) U.S. Cl. .............. 451/8; 451/10; 451/11; 451/41; 451/287; 451/289
(58) Field of Classification Search .............. 451/5, 451/8, 9, 10, 11, 41, 63, 285, 287, 288, 289, 451/290; 156/345.13; 216/84
See application file for complete search history.

(56) References Cited

U.S. PATENT DOCUMENTS

| | | | | |
|---|---|---|---|---|
| 5,531,635 A | * | 7/1996 | Mogi et al. ................... 451/72 |
| 5,951,370 A | * | 9/1999 | Cesna ......................... 451/21 |
| 6,168,499 B1 | * | 1/2001 | Jang .............................. 451/8 |
| 6,319,093 B1 | * | 11/2001 | Lebel et al. ..................... 451/6 |
| 6,752,701 B1 | * | 6/2004 | Honda .......................... 451/67 |
| 2005/0148286 A1 | * | 7/2005 | Saitoh ........................... 451/5 |
| 2006/0194511 A1 | * | 8/2006 | Nagayama et al. ............. 451/5 |
| 2006/0246822 A1 | * | 11/2006 | Swedek et al. ................. 451/5 |
| 2007/0082582 A1 | * | 4/2007 | Gwo et al. ..................... 451/6 |
| 2007/0105343 A1 | * | 5/2007 | Hayashi et al. ............. 438/459 |

FOREIGN PATENT DOCUMENTS

| JP | 2000-006 | 1/2000 |
|---|---|---|
| JP | 2000-006018 | 1/2000 |

* cited by examiner

*Primary Examiner*—Eileen P. Morgan
(74) *Attorney, Agent, or Firm*—Greer, Burns & Crain, Ltd.

(57) ABSTRACT

In a thickness-measuring method during a grinding process, which suppresses wear of a probe coming into contact with a chuck table subjected to self-grind and accurately grinds a workpiece, measurement of wafer thickness is performed only at the commencement and termination of grinding, and a reference probe of a reference side height gauge is separated from the upper surface of the chuck table in the practical grinding time between the commencement and termination so as to interrupt the measurement of wafer thickness, thereby significantly reducing a time of the reference probe brought into contact with the upper surface of the chuck table.

2 Claims, 8 Drawing Sheets

THICKNESS-MEASURING METHOD DURING GRINDING PROCESS

BACKGROUND OF THE INVENTION

1. Field of the Invention

The present invention relates generally to a method of measuring the thickness of a thin plate-like workpiece such as a semiconductor wafer when a grinding tool is pressed against and grinds the surface of the workpiece that is held onto a chuck table for rotation. In particular, the invention relates to a contact type thickness-measuring method in which the thickness of a workpiece is measured by bringing the probes of measurement gauges into contact with two points, the surface of the workpiece and the surface of a chuck table.

2. Description of the Related Art

Some thin plate-like semiconductor substrates which become the materials of semiconductors or electronic components are made of, for example, a single-crystal material such as silicone, or of a compound containing a plurality of elements. Such substrates which were obtained by slicing an ingot of raw material are subjected to chamfering, lapping, etching and other processes. Then, one side or both sides of the substrate are ground to a target thickness. A general method of grinding a substrate involves pressing a grinding wheel against the substrate held on a rotating chuck table while measuring the thickness of the substrate. There is known substrate thickness measurement by use of a two-point contact type thickness measurement gauge which brings the probes of the thickness measurement gauges into contact with respective surfaces of the substrate and the chuck table and determines a difference between both the measurement values as a thickness (see Japanese Patent Laid-Open No. 2000-6018).

When a substrate is ground, a process called "self-grind" is performed in which the surface of a chuck table on which the substrate is placed is evenly ground by grinding machine itself. If the "self-grind" is performed, grinding marks are formed like a radial stripe pattern on the surface of the chuck table. The grinding marks have an asperity of as minute as about 1 to about 2 μm. In order to grind a substrate the probe is brought into contact with the surface of the chuck table and the chuck table is rotated as described above. At this time, if the rotation speed is relatively fast, a phenomenon occurs in which the tip of the probe coming into contact with the chuck table is worn away by the grinding marks.

If the substrate is ground and measured in thickness with the chuck table side probe worn away, then its thickness thus measured is greater than the actual one. If control is exercised such that such an error is compensated for and grinding is performed to provide a target thickness, the substrate is excessively ground as a result to provide a thickness smaller than the target thickness. In particular, the probe on the chuck table side has a high degree of wear since it is located on the outer circumferential portion of the chuck table and the outer circumferential portion is faster in circumferential velocity than the inner circumferential portion. Increased rotation speed makes such tendency noticeable.

SUMMARY OF THE INVENTION

Accordingly, it is an object of the present invention to provide a thickness-measuring method during a grinding process, which suppresses wear of a probe coming into contact with a chuck table subjected to self-ground and accurately grinds a workpiece to a target thickness.

In accordance with an aspect of the present invention, there is provided a thickness-measuring method during a grinding process, in which a plate-like workpiece is held by a rotatable chuck table including a holding area adapted to hold the workpiece and a frame configured flush with the holding area so as to surround the holding area, and the workpiece is rotated together with the chuck table and ground through transfer operation which allows a grinding tool to come close to the workpiece while measuring thickness of the workpiece by a surface position-measuring gauge, the surface position-measuring gauge being a combination of a reference side gauge which brings a reference probe into contact with a surface of the frame of the chuck table and measures a surface position of the chuck table and a workpiece side gauge which brings a variation probe into contact with a surface of the workpiece and measures a surface position of the workpiece. This method includes an initial measurement step in which the surface position-measuring gauge determines the thickness of the workpiece at an initial stage from before grinding of the workpiece to at least a point of time when thickness of the workpiece is reduced after commencement of the grinding; a terminal measurement step in which the surface position-measuring gauge determines the thickness of the workpiece at a terminal stage from just before the thickness of the workpiece reaches a target value through the progress of the grinding to arrival at the target value; and a measurement interruption step in which the reference probe of the reference side gauge is separated from the chuck table to interrupt measurement of the reference side gauge in the grinding performed between the initial step and the terminal step.

The present invention is characterized in that the thickness measurement of the workpiece is performed only at the commencement and termination of the grinding but the measurement is not performed during the actual time of grinding between the commencement and termination. In the measurement interruption step which does not perform the thickness measurement, the reference probe of the reference side gauge is separated from the chuck table to interrupt the measurement by the reference side gauge. The reference probe of the reference side gauge is brought into contact with the chuck table only at the commencement and termination of the grinding process and the thickness measurement is performed only at that time. Thus, the period of time in which the reference probe is in contact with the chuck table can remarkably be reduced.

In this way, even in the case where the chuck table is subjected to self-grind, the degree in which the reference probe of the reference side gauge is worn away by the chuck table is significantly reduced. Consequently, the workpiece can accurately be measured and also ground to a target thickness. It is only necessary to determine timing of commencing the terminal step from the measurement interruption step on the basis of the measurement value of the workpiece side gauge whose variation probe is in contact with the workpiece even during the measurement interruption step.

The present invention interrupts the measurement by separating the reference probe of the reference side gauge from the chuck table in the measurement interruption step. However, at this time, the measurement by the workpiece side gauge may be interrupted by separating from the workpiece the variation probe of the workpiece side gauge brought into contact with the workpiece. The wear of the variation probe coming into contact with the rotating workpiece is suppressed by interrupting the measurement by the workpiece side gauge, thereby further improving measurement accuracy. Incidentally, timing of commencing the terminal measurement step from the measurement interruption step can be determined on the basis of the travel amount of the grinding tool.

According to the present invention, the thickness measurement of the workpiece is performed only at the commencement and termination of the grinding and is interrupted in the practical time of grinding between the commencement and the termination by separating the reference probe of the reference side gauge from the chuck table. Therefore, the period of time in which the reference probe is in contact with the chuck table can remarkably be reduced. The wear of the reference probe coming into contact with the chuck table subjected to self-grind can be suppressed as much as possible. Consequently, there is produced an effect of accurately grinding the workpiece to the target thickness.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will hereinafter be described with reference to the drawings.

[1] The Configuration and General Operation of a Grinding Machine

Figure 1:
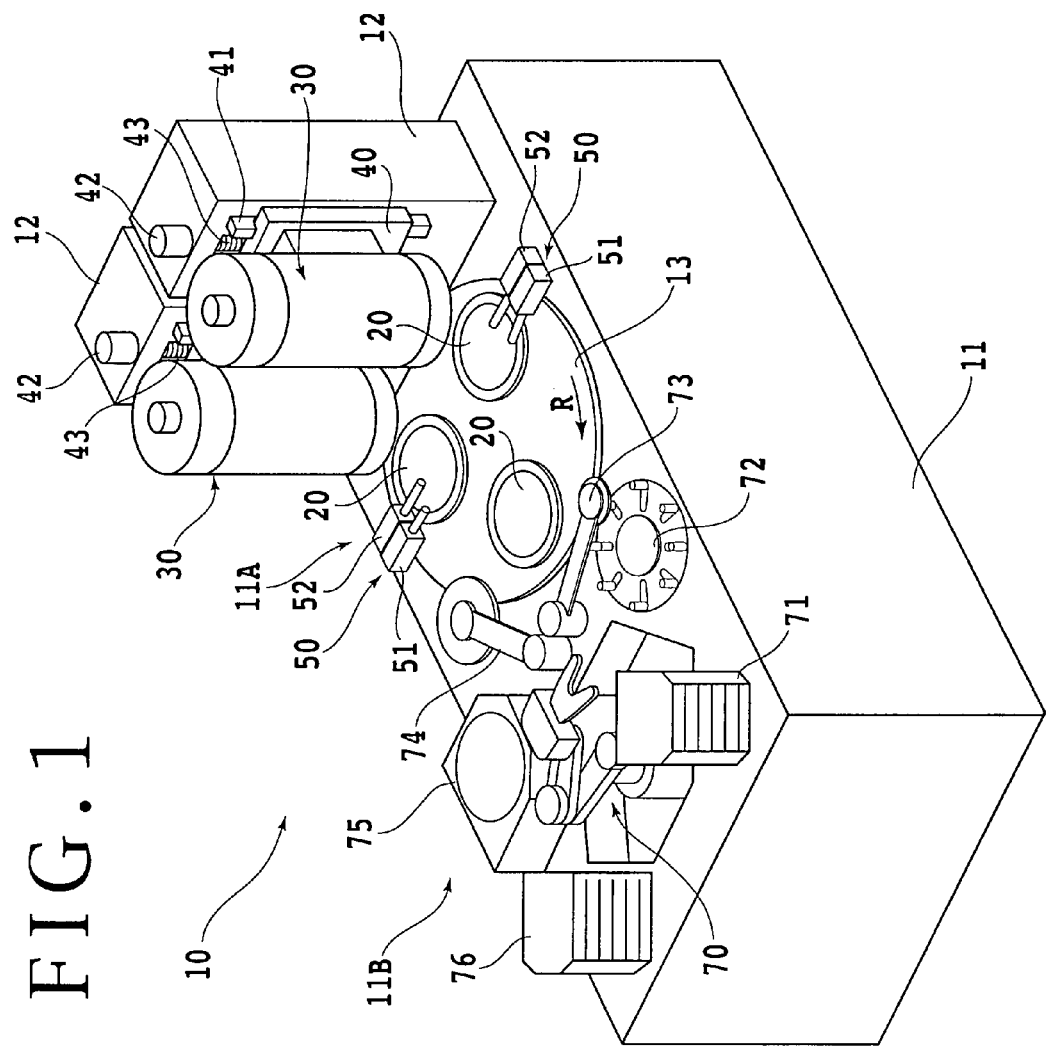
FIG. 1 is a perspective view of a grinding machine to which a measuring method according to an embodiment of the present invention is applied.
Figure 2A:
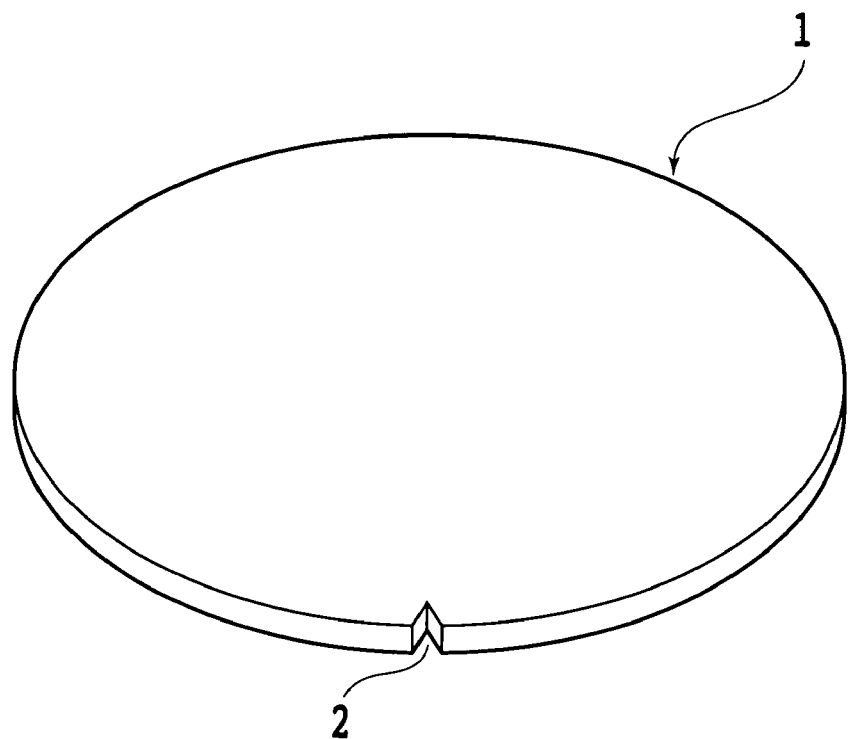
FIG. 2A is a perspective view of a wafer ground by the grinding machine of FIG. 1.
Figure 2B:
FIG. 2B is a lateral view of the wafer of FIG. 2A.

FIG. 1 illustrates a grinding machine 10 which grinds the surface of a workpiece, i.e., a semiconductor wafer (hereinafter, abbreviated as the wafer) such as a silicone wafer. FIGS. 2A and 2B illustrate a wafer to be ground. This wafer 1 is on a raw material stage in which a primary material, namely, an ingot is sliced, the sliced one is lapped to adjust its thickness, and then mechanically damaged layers formed on both surfaces of the lapped material are removed by etching. The wafer 1 is formed at its outer circumferential edge with a V-shaped notch 2 which designates crystal orientation. The wafer 1 has a thickness of e.g. about 700 μm, from which a thickness of, e.g. about 20 μm is removed by the grinding machine 10.

The grinding machine 10 illustrated in FIG. 1 includes a rectangular parallelepipedic base 11 with a flat upper surface. In FIG. 1, the longitudinal direction, width direction and vertical direction of the base 11 are designated by a Y-direction, an X-direction and a Z-direction, respectively. Columns 12 juxtaposed to each other in the X-direction are provided at one end portion of the base 11 in the Y-direction so as to extend upright, making a pair. On the base 11 a processing area 11A where the wafer 1 is ground is provided close to the columns 12 in the Y-direction. On a side opposite to the columns 12 an attachment/detachment area 11B is provided where the wafer 1 to be processed is fed to the processing area 11A and the wafer 1 processed is recovered.

A disklike turn table 13 is rotatably provided in the processing area 11A so as to have a rotational axis parallel to the Z-direction and a horizontal upper surface. This turn table 13 is turned in the direction of arrow R by a rotational drive mechanism not shown. A plurality of (three, in this case) disklike chuck tables 20 are provided on the outer circumferential portion of the turn table 13 so as to be circumferentially spaced apart from each other at equal intervals. Each of the chuck tables 20 has a rotational axis parallel to the Z-direction and a horizontal upper surface.

The chuck table 20 is of generally well-known vacuum chuck type and sucks and holds the wafer 1 placed on the upper surface thereof. Referring to FIGS. 3A, 3B, 4A and 4B, the chuck table 20 has a circular suction area 21 made of porous ceramics material on the upper surface thereof and the wafer 1 is sucked and held on the upper surface 21a of the suction area 21. An annular frame 22 is formed around the suction area 21 and an upper surface 22a of the frame 22 is continuously flush with the upper surface 21a of the suction area 21. The chuck tables 20 are each rotated on its axis in one direction or in both directions by the rotational drive mechanism, not shown, provided in the turn table 13 and move around the axis of the turn table 13 when the turn table 13 is rotated.

As shown in FIG. 1, in a state where two chuck tables 20 are located close to the columns 12 so as to be aligned in the x-direction, grinding units 30 are each disposed right above a corresponding one of the two chuck tables 20. The chuck tables 20 are each positioned by the rotation of the turn table 13 at three positions, respective grinding positions below the grinding units 30 and an attachment-detachment position closest to the attachment-detachment area 11B. The grinding positions are two, at which the respective grinding units 30 are arranged. In this case, respective grinding positions on the upstream side (the back side in the figure) and downstream side of the transfer direction of the chuck tables 20 on the basis of the rotation of the turn table 13 are referred to as a first grinding position and a second grinding position, respectively, the transfer direction being indicated with arrow R.

Each grinding unit 30 is secured to a slider 40 which is mounted to the column 12 in an ascendable and descendable manner. The slider 40 is slidably mounted to guide rails 41 extending in the Z-direction and is movable in the Z-direction by a ball-screw type drive mechanism 43 driven by a servo motor 42. Each grinding unit 30 is lifted and lowered in the Z-direction by the drive mechanism 43. The grinding unit 30 is operated to lower and come close to the chuck table 20 and grinds an exposed surface of the wafer 1 held by the chuck table 20.

Figure 3B:
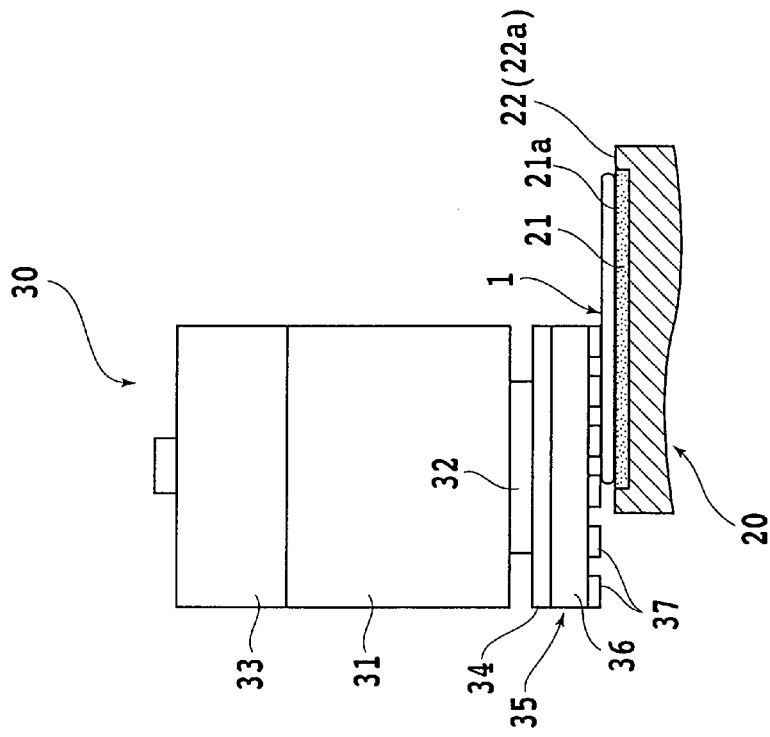
FIG. 3B is a lateral view of the grinding unit of FIG. 3A.
Figure 3A:
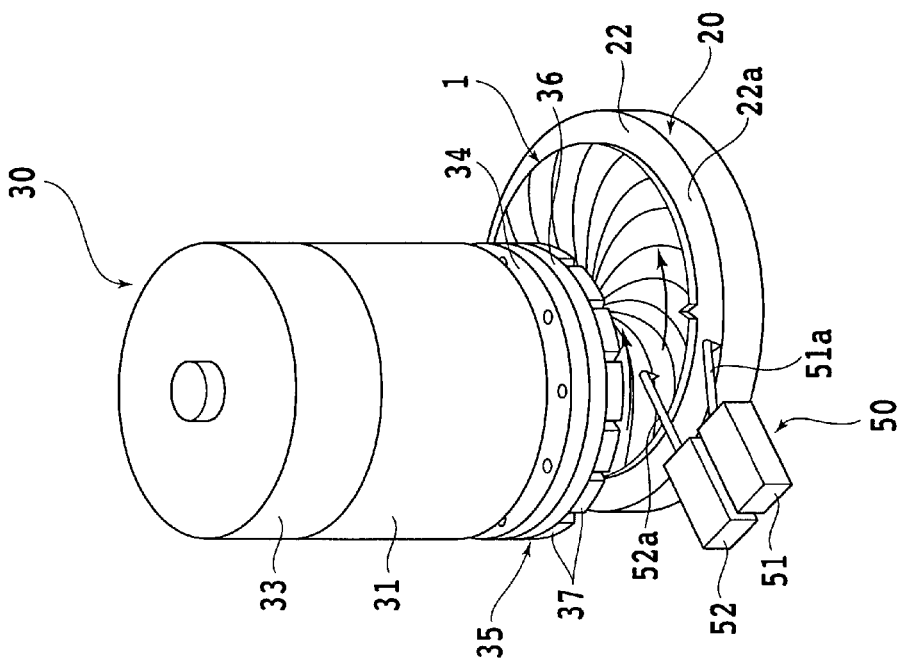
FIG. 3A is a perspective view illustrating a state where a grinding unit provided for the grinding machine of FIG. 1 grinds the surface of the wafer.

Referring to FIGS. 3A and 3B, the grinding unit 30 includes a cylindrical spindle housing 31 whose axial line extends in the Z-direction; a spindle shaft portion 32 supported by the spindle housing 31 coaxially therewith and rotatably relative thereto; a motor 33 secured to the upper end of the spindle housing 31 to rotatably drive the spindle shaft portion 32; and a disklike flange 34 coaxially secured to the lower end of the spindle shaft portion 32. A cup wheel (grinding tool) 35 is detachably attached to the flange 34 by attachment means such as screw cramp.

The cup wheel 35 includes a disklike frame 36 and a plurality of grinding stones 37 which are secured to the lower end face of the frame 36 so as to be annularly arranged over the entire outer circumferential portion thereof. The cup wheel 35 whose grinding stones 37 contain abrasive grains of e.g. #2000 to #8000 is attached to the flange 34 of the grinding unit 30 for first grinding located above the first grinding position. The cup wheel 35 whose grinding stones 37 contain abrasive grains of e.g. #10000 or more is attached to the flange 34 of the grinding unit 30 for second grinding located above the second grinding position. A grinding water supply mechanism (not shown) is provided for the flange 34 and the cup wheel 35. The grinding water supply mechanism feeds grinding water used to cool and lubricate the ground surface or to expel grinding dust. A water supply line is connected to the grinding water supply mechanism. The grinding outer diameter of the cup wheel 35, namely, the diameter of the outer circumferential edge of the plurality of grinding stones 37 is set a value almost equal to or slightly greater than the radius of the wafer 1.

Figure 4A:
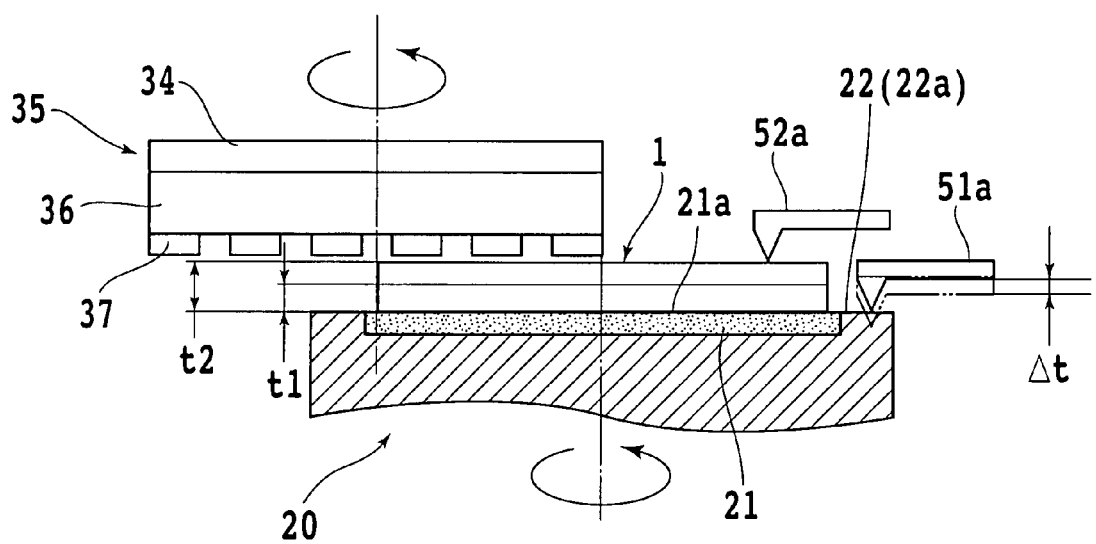
FIG. 4A is a lateral view illustrating the wafer ground by the grinding unit provided for the grinding machine of FIG. 1, and a reference probe and a variation probe of a thickness-measuring gauge.

Reference numeral 50 in FIGS. 3A and 3B denotes a thickness-measuring gauge (surface position-measuring gauge) composed of a reference side height gauge (reference side gauge) 51 and a wafer side height gauge (workpiece side height gauge) 52. The reference side height gauge 51 detects a height position of an upper surface 22$a$ of the frame 22 of the chuck table 20 not covered by the wafer 1 by the tip of a swinging reference probe 51$a$ coming into contact with the upper surface 22$a$. The wafer side height gauge 52 detects a height position of an upper surface, namely, a surface to be ground, of the wafer 1 held by the chuck table 20 by the tip of a swinging variation probe 52$a$ coming into contact with the upper surface. The thickness-measuring gauge 50 determines the thickness of the wafer 1 based on a value obtained by subtracting a measurement value of the reference side height gauge 51 from a measurement value of the wafer side height gauge 52. As shown in FIG. 4A, if the wafer 1 is ground to a target thickness t1, the original thickness t2 is first measured before the grinding and (t2−t1) is taken as an amount of grounding.

The grinding unit 30 grinds the surface of the wafer 1 by lowering the cup wheel 35 at a predetermined speed (e.g. about 0.3 to 0.5 μm/sec) while rotating at e.g. 2000 to 5000 rpm and pressing the grinding stones 37 of the cup wheel 35 against the surface of the wafer 1. During the grinding, the wafer 1 is rotated in the same direction as that of the cup wheel 35 along with the chuck table 20. The rotation speed of the chuck table 20 is usually about 10 rpm up to about 300 rpm.

As shown in FIG. 4A, the dimensional relationship between the cup wheel 35 and the chuck table 20 is such that the radius of the chuck table 20 is smaller than the diameter of the cup wheel 35 and greater than the radius of the cup wheel 35. The cup wheel 35 is positioned to be faced to the wafer 1 so that the outer circumferential edge of the grinding stone 37 passes through the rotation center of the chuck table 20, namely, the center of the wafer 1. Because of this positional relationship, the entire front surface of the rotating wafer 1 is uniformly ground by the grinding stones 37 of the cup wheel 35. The wafer 1 is firstly ground by the grounding unit 30 at the first grinding position and then is transferred to the second grinding position by the turn table 13 rotated in the direction of symbol R shown in FIG. 1, where the wafer 1 is secondarily ground by the grinding unit 30.

Referring again to FIG. 1, a two-joint link type pick-up robot 70 which moves upward and downward is installed at the center of the attachment-detachment area 11B. A supply cassette 71, a positioning table 72, a supply arm 73, a recovery arm 74, a spinner type cleaning system 75 and a recovery cassette 76 are arranged around the pick-up robot 70 counterclockwise as viewed from above. The cassettes 71, 76 are each adapted to store a plurality of the wafers 1 in such a stacked manner as to take a horizontal posture and to be spaced apart from each other at given intervals above and below. The cassettes 71, 76 are disposed at respective predetermined positions on the base 11.

A wafer 1 to be ground is first taken out of the supply cassette 71 by the pick-up robot 70 and placed on the positioning table 72 at a fixed position. The wafer 1 is next picked up from the positioning table 72 by the supply arm 73 and placed on the chuck table 20 standing by at the attachment/detachment position with its to-be-ground surface up. The wafer 1 is transferred to the first grinding position and then to the second grinding position by the turn table 13 turning in the direction of R, at which the surface is ground by the grinding unit 30 as described above.

The wafer 1 that has been subjected to secondary grinding is returned to the attachment/detachment position by the turn table 13 further turning in the direction of R. The wafer 1 on the chuck table 20 that has returned to the attachment/detachment position is picked up by the recovery arm 74 and transferred to the cleaning system 75, where it is cleaned with water and dried. The wafer 1 that has been cleaned by the cleaning system 75 is transferred by the pick-up robot 70 into the recovery cassette 76 for storage.

[2] Self-Grind of the Chuck Table

Before the wafer 1 is ground, the upper surface (the upper surface 21$a$ of the suction area 21 and the upper surface 22$a$ of the frame 22) of the chuck table 20 is evenly ground in advance by the cup wheel 35 of the grinding unit 30. Such a grinding process called self-grind is carried out to place the wafer 1 horizontally. Since the extremely hard suction area 21 is ground, the grinding stones 37 of the cup wheel 35 uses metal or vitrified grinding stone of about #600.

Figure 4B:
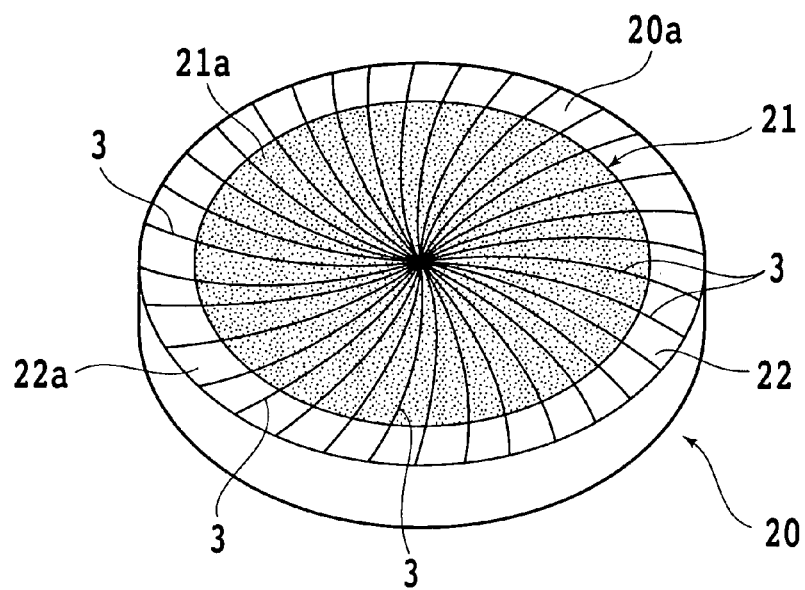
FIG. 4B is a perspective view illustrating a chuck table whose surface is subjected to self-grind by the grinding unit.

The self-grind of the chuck table 20 is performed such that the grinding unit 30 is lowered by the drive mechanism 43 while the chuck table 20 is rotated and the rotating cup wheel 35 is pressed against the upper surface of the chuck table 20. As shown in FIG. 4B, since the outer circumferential edge of the grinding stones 37 of the cup wheel 35 passes through the rotation center of the chuck table 20, grinding marks 3 formed by the grinding stones 37 as a large number of arcs extending radially from the center are left on the upper surface of the chuck table 20. The grinding marks 3 are fracturing trajectories of the grinding grains in the grinding stones 37 and exhibit a stripe pattern resulting from an asperity of about 1 to about 2 μm.

When the wafer 1 is ground, the tip of the reference probe 51$a$ provided for the reference side height gauge 51 is brought into contact with the upper surface 22$a$ of the frame 22 of the chuck table 20 formed with the grinding marks 3. If the chuck table 20 is rotated at a relatively high-speed (e.g., 300 rpm mentioned above), as the number of grinding processes is increased through the operation over a prolonged period of time, the tip of the reference probe 51$a$ is ground and worn away by the grinding marks. Δt of FIG. 4A indicates an amount of lowering of the reference probe 51$a$ resulting from the worn tip of the reference probe 51$a$.

If the reference probe 51a is increased in depth of wear, it lowers from a normal position in a not-worn state by an amount according to the depth of wear. Thus, a difference between the variation probe 52a and the reference probe 51a is increased. The measurement value of the thickness-measuring gauge 50 is greater than the actual thickness of the wafer 1. If control is exercised such that such an error is compensated for and grinding is performed to provide a target thickness, consequently the wafer 1 is excessively ground to have a thickness smaller than the target thickness. To eliminate such a disadvantage, the present embodiment adopts the following measuring method.

[3] A Wafer Thickness-Measuring Method During Grinding

A description is made of a specific operation in which a wafer 1 is ground to the target thickness while measuring the thickness of the wafer 1 at the first grinding and at the second grinding.

Figure 5A:
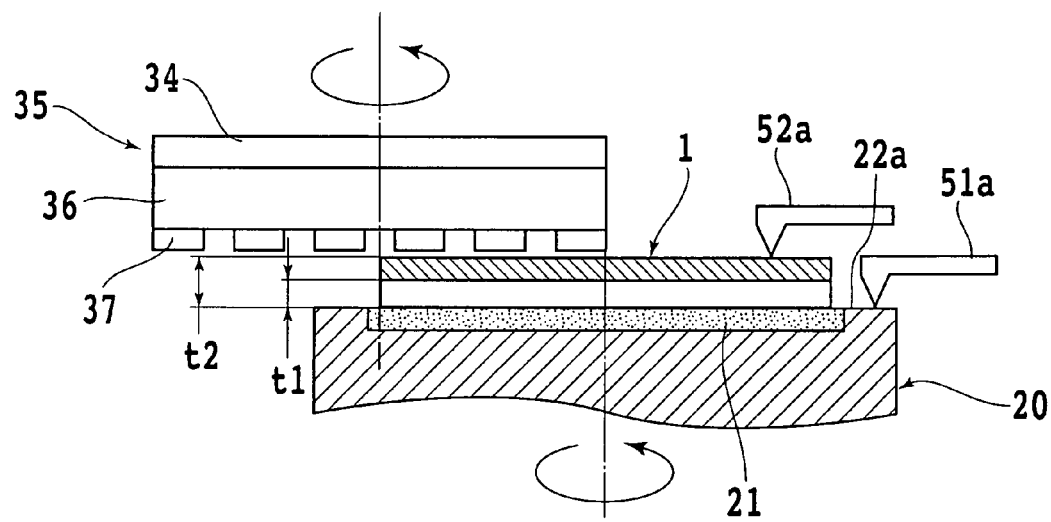
FIGS. 5A through 5D are lateral views sequentially illustrating the measuring method according to the embodiment of the present invention.

(A) A Method of Interrupting the Measurement by the Reference Side Height Gauge: FIGS. 5A through 5D A wafer 1 held by the chuck table 20 is first transferred to a grinding position. At this time, the chuck table 20 is rotated at a rotation speed encountered during grinding. As shown in FIG. 5A, the reference probe 51a of the reference side height gauge 51 is brought into contact with the upper surface 22a of the frame 22 of the chuck table 20. In addition, the variation probe 52a of the wafer side height gauge 52 is brought into contact with the upper surface of the wafer 1. At this time, a reference measurement value (zero point of thickness measurement) of the reference side height gauge 51 is measured and the thickness of the wafer 1 before the grinding is determined by the thickness measurement gauge 50. A difference between the reference measurement value mentioned above and the thickness of the wafer before the grinding is recognized as wafer thickness. Inter-probe position compensation is not updated until the predetermined processing number of wafers. This inter-probe position compensation is performed by bringing the reference probe 51a of the reference side height gauge 51 and the variation probe 52a of the wafer side height gauge 52 into contact with the upper surface 21a of the suction area 21 and the upper surface 22a of the frame 22, respectively. Specifically, during continuous grinding of the predetermined number of wafers, the probe position correction values of the reference side height gauge 51 and the wafer side height gauge 52 are kept constant. A point where the thickness of the wafer 1 is measured by the wafer side height gauge 52, namely, the contact point of the variation probe 52a is preferably an outer circumferential portion close to the outer circumferential edge of the wafer 1 as indicated with a broken line of FIG. 3A.

Figure 5B:
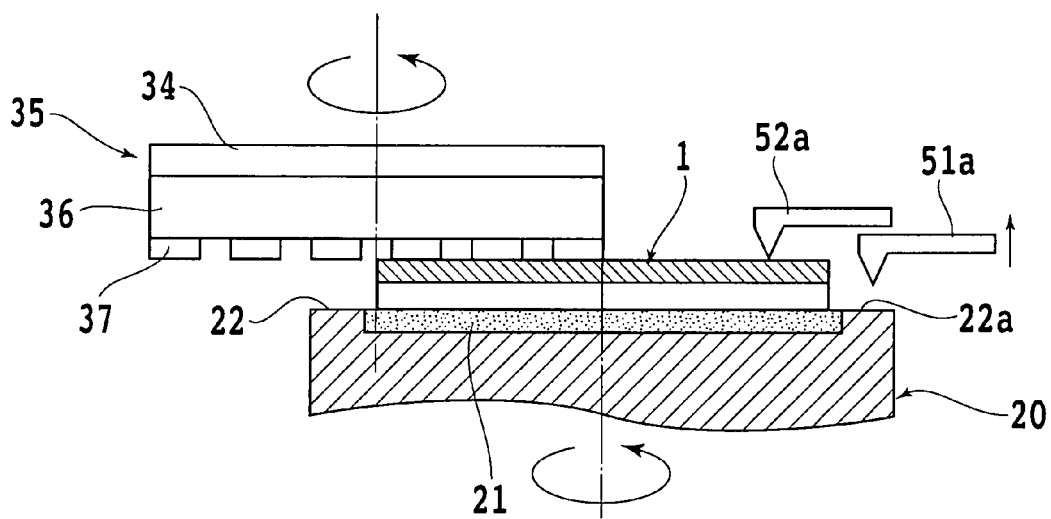

The grinding unit 30 is lowered and the grinding stones 37 of the cup wheel 35 are pressed against the surface of the wafer 1, starting grinding. When it is confirmed that the wafer 1 is reduced in thickness, the reference probe 51a of the reference side height gauge 51 is withdrawn upward, that is, separated from the upper surface 22a of the frame 22 as shown in FIG. 5B. For example, in the case where the total amount of grinding for the first grinding is about 20 μm in thickness, if it is confirmed that a thickness of e.g. about 5 μm is reduced, the reference probe 51a is separated from the upper surface 22a of the frame 22. This is an initial measuring step.

Next, the wafer 1 is continuously ground in the state where the reference probe 51a is intactly spaced apart from the chuck table 20 and the reference side height gauge 51 does not perform the measurement (measurement interruption step). The thickness of the wafer 1 during the grinding can be recognized by comparing the reference measurement value detected by the reference side height gauge 51 before the grinding of the wafer with the measurement value of the wafer side height gauge 52 where swinging variation probe 52 comes into contact with the surface of the wafer 1 being ground.

Figure 5C:
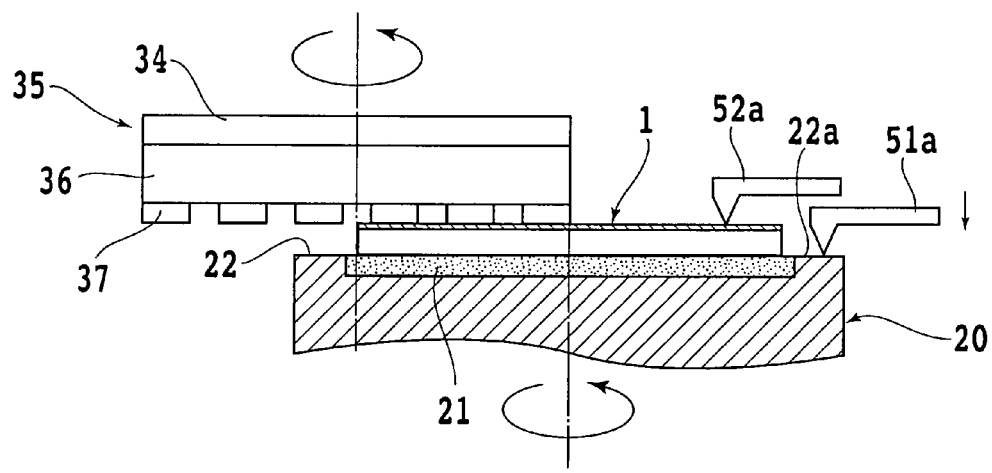
Figure 5D:
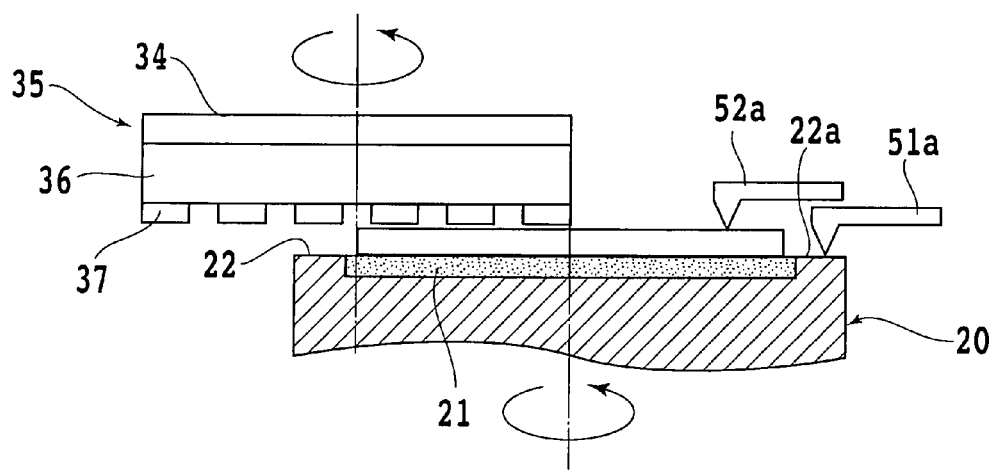

When it is recognized that the thickness of the wafer 1 is just before it reaches the target thickness, the reference probe 51a is again brought into contact with the upper surface 22a of the frame 22 of the chuck table 20. In addition, an accurate measurement value at the height position of the upper surface of the chuck table 20 detected by the reference side height gauge 51 is compared with the measurement value of the wafer side height gauge 52 and the wafer 1 is ground to the target thickness (FIGS. 5C and 5D: terminal measurement step). For example, when it is confirmed that the thickness before it reaches the target thickness is 5 μm, the reference probe 51a is again brought into contact with the upper surface 22a of the frame 22. At this time, the measurement value of the reference side height gauge 51 is again confirmed as the reference measurement value. The measurement values of the wafer side height gauge 51 and the wafer side height gauge 52 are compared with each other. The value thus compared is accurately converted to the amount of grinding to the target value and the grinding is performed by the converted amount.

The thickness measurement method described above is used to grind the wafer 1 to the target thickness. The thickness measurement method is characterized by the following. The reference probe 51a of the reference side height gauge 51 is brought into contact with the upper surface 22a of the frame 22 of the chuck table 20 only at the commencement and termination of the grinding. While the grinding is practically performed between the commencement and termination, the reference probe 51a is separated from the chuck table 20 to interrupt the thickness measurement by the reference side height gauge 51. In the measurement interruption step in which the wafer side height gauge 52 does not measure the thickness of the wafer 1, the grinding state of the wafer 1 can be confirmed based on the measurement value of the wafer side height gauge 52. This makes it possible to determine the commencing time of the terminal measurement step in which the reference probe 51a is again brought into contact with the chuck table 20 to resume the thickness measurement of the wafer 1.

According to the thickness-measuring method of the present invention, the reference probe 51a of the reference side height gauge 51 is brought into contact with the upper surface of the chuck table 20 (the upper surface 22a of the frame 22) only at the commencement and termination of the grinding process as described above; therefore, its contact time can significantly be reduced. The degree in which the tip of the reference probe 51a is worn away by the chuck table 20 subjected to self-grind is remarkably lowered. Consequently, even if the grinding machine is operated for long periods of time to increase the number of grinding the wafers 1, the wafer 1 can accurately be measured in thickness and can be ground to the target thickness.

If operation of correcting positions between the probes of the reference side height gauge 51 and wafer side height gauge 52 is performed every time a single wafer is ground, a measurement error does not occur no matter how much the reference probe 51a is worn away. Thus, the present embodiment is not effective so much. However, the grinding machine may automatically be operated continuously without performing the inter-probe position correcting operation during grinding of a large number of wafers. In such a case, the wear of the reference probe 51a progresses so that the tip of the reference probe 51a positionally lowers as compared with the position of the tip of the variation probe 52a of the wafer side height gauge 52. Thus, an error occurs in which the measurement value is greater than the actual thickness. The present embodiment can effectively be applied to such a situation that the reference probe 51a is worn away due to the continuous operation, whereby a measurement error is likely to occur.

Figure 6A:
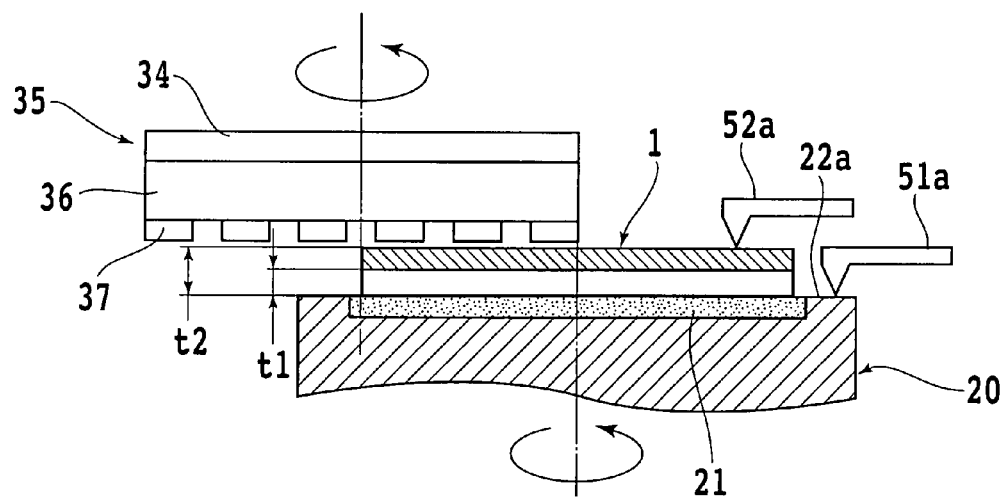
FIGS. 6A through 6D are lateral views sequentially illustrating a measuring method according to another embodiment of the present invention.
Figure 6B:
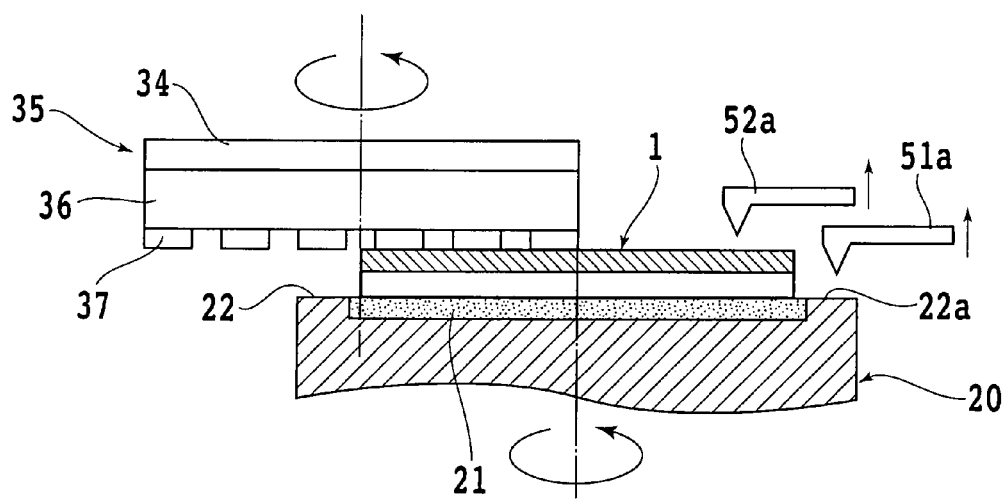

(B) A Method of Interrupting Measurements by Both the Reference Side and Wafer Side Height Gauges: FIGS. 6A through 6D The thickness-measuring method shown in FIGS. 5A through 5D allows only the reference probe 51a to be separated from the chuck table 20 in the measurement interruption step; however, also the variation probe 52a may be separated from the wafer 1. FIGS. 6A through 6D illustrate such a method. As shown in FIG. 6A, before grinding, the reference probe 51a and the variation probe 52a are first brought into contact with the upper surface 22a of the frame 22 of the chuck table 20 and with the upper surface of the wafer 1, respectively. The reference measurement value of the reference side height gauge 51 is reset and the thickness of the wafer 1 before grinding is measured by the thickness-measuring gauge 50. Next, the grinding unit 30 is lowered and the grinding stones 37 of the cup wheel 35 are pressed against the surface of the wafer 1, starting grinding. Then it is confirmed that the wafer 1 is reduced in thickness. In this way such an initial measurement step is passed. Thereafter, as shown in FIG. 6B, the reference probe 51a and the variation probe 52a are withdrawn upward to interrupt the thickness measurements by the reference side height gauge 51 and wafer side height gauge 52. In this state, the wafer 1 is continuously ground (the measurement interruption step).

Figure 6C:
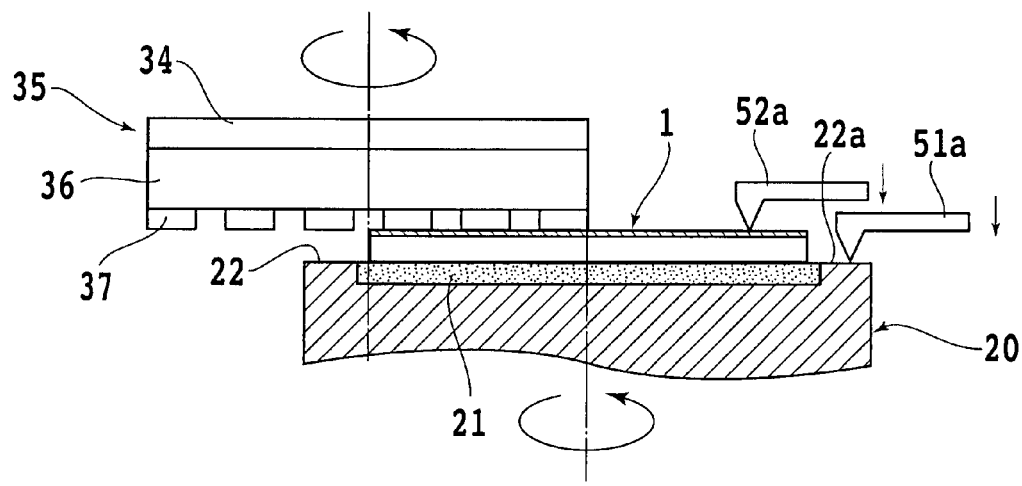
Figure 6D:
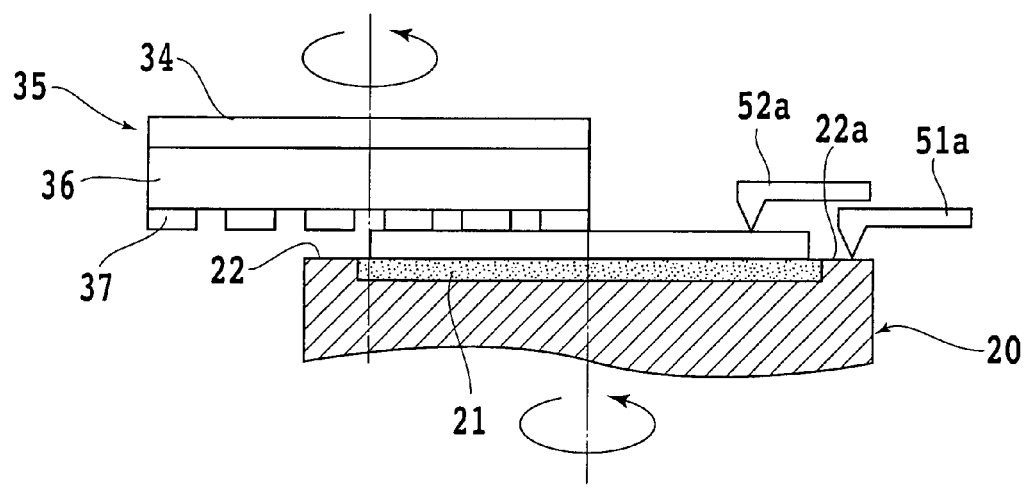

In the measurement interruption step in this case, the amount of grinding the wafer 1 is recognized based on the travel amount of the grinding unit 30 driven by the drive mechanism 43. When it is thus recognized that the thickness of the wafer 1 is just before it reaches the target thickness, the reference probe 51a and the variation probe 52a are again brought into contact with the upper surface 22a of the frame 22 of the chuck table 20 and with the upper surface of the wafer 1, respectively. In this way, the wafer is ground to the target thickness while accurately measuring the thickness of the wafer 1 (FIGS. 6C and 6D: terminal measurement step).

As illustrated in FIGS. 6A through 6D, also the variation probe 52a is separated apart from the wafer 1 while the reference probe 51a is separated from the chuck table 20 in the measurement interruption step. Thus, the wear of the variation probe 52a coming into contact with the rotating wafer 1 can be suppressed with the result that an effect is produced that wafer thickness measuring accuracy is improved.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A thickness-measuring method during a grinding process, in which a plate-like workpiece is held by a rotatable chuck table including a holding area adapted to hold the workpiece and a frame configured flush with the holding area so as to surround the holding area, and the workpiece is rotated together with the chuck table and ground through transfer operation which allows a grinding tool to come close to the workpiece while measuring thickness of the workpiece by a surface position-measuring gauge, the surface position-measuring gauge being a combination of a reference side gauge which brings a reference probe into contact with a surface of the frame of the chuck table and measures a surface position of the chuck table and a workpiece side gauge which brings a variation probe into contact with a surface of the workpiece and measures a surface position of the workpiece, the method comprising:

an initial measurement step in which the surface position-measuring gauge determines the thickness of the workpiece at an initial stage from before grinding of the workpiece to at least a point of time when the thickness of the workpiece is reduced after commencement of the grinding;

a terminal measurement step in which the surface position-measuring gauge determines the thickness of the workpiece at a terminal stage from just before the thickness of the workpiece reaches a target value through the progress of the grinding to arrival at the target value; and a measurement interruption step in which the reference probe of the reference side gauge is separated from the chuck table to interrupt measurement of the reference side gauge in the grinding performed between the initial step and the terminal step.

2. The thickness-measuring method according to claim 1, wherein in the measurement interruption step both the reference side gauge and the workpiece side gauge interrupt the measurement and commencing time of the terminal measurement step is determined based on the travel amount of the grinding tool.

\* \* \* \* \*

UNITED STATES PATENT AND TRADEMARK OFFICE
CERTIFICATE OF CORRECTION

PATENT NO. : 7,500,902 B2  
APPLICATION NO. : 11/900845  
DATED : March 10, 2009  
INVENTOR(S) : Susumu Nomiya It is certified that error appears in the above-identified patent and that said Letters Patent is hereby corrected as shown below:

Title page, item "(56) References Cited - Foreign Patent Documents" delete "JP 2000-006 1/2000".

Signed and Sealed this

Nineteenth Day of May, 2009

JOHN DOLL  
*Acting Director of the United States Patent and Trademark Office*